(12) United States Patent
Moon et al.

(10) Patent No.: US 12,453,106 B2
(45) Date of Patent: Oct. 21, 2025

(54) CAPACITOR DEVICE AND SEMICONDUCTOR DEVICE INCLUDING THE SAME

(71) Applicant: Samsung Electronics Co., Ltd., Suwon-si (KR)

(72) Inventors: Taehwan Moon, Suwon-si (KR); Jinseong Heo, Seoul (KR); Seunggeol Nam, Suwon-si (KR); Dukhyun Choe, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 17/964,365

(22) Filed: Oct. 12, 2022

(65) Prior Publication Data

US 2023/0121102 A1 Apr. 20, 2023

(30) Foreign Application Priority Data

Oct. 18, 2021 (KR) ........................ 10-2021-0138844

(51) Int. Cl.
*H10D 64/60* (2025.01)
*H10D 1/62* (2025.01)

(52) U.S. Cl.
CPC .............. *H10D 1/62* (2025.01); *H10D 64/60* (2025.01)

(58) Field of Classification Search
CPC ........ H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 63/30; H10B 63/32; H10B 63/34; H10B 63/80; H10B 63/84; H10B 99/00; H10B 99/10; H10B 99/02; H10B 53/00–50; H10B 51/00–50; H10B 12/30; H01L 23/5226; H01L 23/528; H01L 29/41775; H01L 29/42324; H01L 29/4234; H01L 21/02532;
(Continued)

(56) References Cited

U.S. PATENT DOCUMENTS 9,871,044 B2 1/2018 Pandey et al.
10,043,567 B2 8/2018 Slesazeck et al.
(Continued)

FOREIGN PATENT DOCUMENTS

CN 113745327 A 12/2021
EP 3 910 687 A1 11/2021
(Continued)

OTHER PUBLICATIONS

Extended European Search Report dated Feb. 28, 2023 issued in European Patent Application No. 22201349.2.

*Primary Examiner* — Moin M Rahman
(74) *Attorney, Agent, or Firm* — Harness, Dickey & Pierce, P.L.C.

(57) ABSTRACT

A capacitor device and a semiconductor device including the capacitor device are provided. The capacitor device includes first and second electrodes spaced apart from each other, and a dielectric layer provided between the first electrode and the second electrode. The dielectric layer includes a dielectric material in which ferroelectrics and antiferroelectrics are mixed with each other.

17 Claims, 17 Drawing Sheets

(58) Field of Classification Search
CPC ......... H01L 21/02636; H01L 21/31111; H01L 21/31155; H01L 21/76802; H01L 21/76877; H01L 21/76897; H01L 29/40114; H01L 29/40117; H01L 29/66545; H01L 29/7883; H01L 21/76831; H01L 21/76805; H01L 29/78; H01L 21/7687; H01L 23/49589; H01L 23/5223; H01L 27/0288; H01L 27/0629; H01L 27/0727; H01L 27/0733; H01L 27/0794; H01L 27/1085; H01L 27/3265; H01L 29/66181; H01L 29/7408; H01L 2924/1205; H01L 2924/19041; H01L 28/40–92; H01L 27/0805; H01L 27/101; H01L 21/823807; H01L 21/823821; H01L 21/823418; H01L 21/823412; H01L 29/66439; H01L 29/66795; H01L 27/0886; H01L 29/78684; H01L 27/0924; H01L 21/823814; H01L 29/78618; H01L 21/823828; H01L 29/42392; H01L 29/78696; H01L 29/785; H01L 29/78654; H01L 2029/7858; H01L 21/0245; H01L 21/76846; H01L 21/76849; H01L 29/7845; H01L 21/76834; H01L 29/41791; H01L 21/76801; H01L 21/0337; H01L 21/28247; H01L 21/28568; H01L 21/3086; H01L 21/31105; H01L 21/31144; H01L 21/76224; H01L 21/823481; H01L 21/823842; H01L 21/823857; H01L 21/823871; H01L 21/823878; H01L 23/5283; H01L 23/53266; H01L 27/1104; H01L 28/24; H01L 29/0847; H01L 29/516; H01L 29/6653; H01L 29/7854; H01L 21/28518; H01L 23/5329; H01L 27/0207; H01L 28/20; H01L 29/41783; H01L 27/0922; H01L 29/167; H01L 29/66636; H01L 29/7851; H01L 29/7846; H01L 29/165; H01L 23/53209; H01L 23/53238; H01L 21/76816; H01L 29/0649; H01L 29/66818; H01L 29/7848; H01L 29/7843; H01L 21/76232; H01L 29/6656; H01L 29/0653; H01L 21/823431; H01L 21/76883; H01L 21/76885; H01L 29/665; H01L 21/02164; H01L 21/0217; H01L 21/0332; H01L 21/823437; H01L 21/823475; H01L 24/16; H01L 29/7842; H01L 29/7853; H01L 2224/16227; H01L 24/32; H01L 24/73; H01L 2224/32225; H01L 2224/73204; H01L 23/48; H01L 21/28291; G11C 11/221; G11C 11/223; H10D 64/689; H10D 30/0415; H10D 30/701; H10D 1/682–688; H10D 1/60–716; H10D 64/60

See application file for complete search history.

(56) References Cited

U.S. PATENT DOCUMENTS

| | | |
|---|---|---|
| 10,056,393 B2 | 8/2018 | Schröder et al. |
| 2003/0227803 A1 | 12/2003 | Natori et al. |
| 2016/0005961 A1* | 1/2016 | Ino .................. H10N 70/231 |
| | | 257/295 |
| 2016/0049248 A1* | 2/2016 | Imura ................ H01G 4/1218 |
| | | 501/139 |
| 2017/0133383 A1* | 5/2017 | Pandey ................ H10B 12/31 |
| 2020/0055134 A1 | 2/2020 | Heo et al. |
| 2020/0212168 A1* | 7/2020 | Yoo .................. H01L 29/78391 |
| 2020/0286985 A1 | 9/2020 | Lim et al. |
| 2020/0335333 A1* | 10/2020 | Kang .................... H01L 28/40 |
| 2020/0350324 A1 | 11/2020 | Hoffmann |
| 2021/0359100 A1* | 11/2021 | Maeng ................... H10B 51/00 |
| 2021/0359101 A1 | 11/2021 | Heo et al. |
| 2022/0181494 A1* | 6/2022 | Chen .................. H01L 29/66795 |

FOREIGN PATENT DOCUMENTS

| KR | 10-1632496 B1 | 6/2016 |
|---|---|---|
| KR | 10-2021-0138993 A | 11/2021 |

* cited by examiner

CAPACITOR DEVICE AND SEMICONDUCTOR DEVICE INCLUDING THE SAME

CROSS-REFERENCE TO RELATED APPLICATION

This application is based on and claims priority under 35 U.S.C. § 119 to Korean Patent Application No. 10-2021-0138844, filed on Oct. 18, 2021, in the Korean Intellectual Property Office, the disclosure of which is incorporated by reference herein in its entirety.

BACKGROUND

Some example embodiments relate to a capacitor device and a semiconductor device including the capacitor.

In dynamic random access memory (DRAM), each cell is composed of a transistor and a capacitor device (e.g. a 1T1C cell). A capacitor device requires/uses a dielectric layer that may have a high dielectric constant in order to secure capacitance. However, in most materials existing in nature, when a dielectric constant increases, a band gap decreases and/or a leakage current increases. This leakage current may be a factor that deteriorates the operating characteristics of the capacitor device.

SUMMARY

Provided are capacitor devices and/or semiconductor devices including the capacitor devices.

Additional aspects will be set forth in part in the description which follows and, in part, will be apparent from the description, or may be learned by practice of the presented embodiments of the disclosure.

According to some example embodiments, a capacitor device includes first and second electrodes spaced apart from each other, and a dielectric layer between the first electrode and the second electrode and including a dielectric material in which ferroelectrics and antiferroelectrics are mixed with each other.

Each of the ferroelectrics and the antiferroelectrics may include a fluorite-based oxide (an oxide having a fluorite structure). The fluorite-based oxide may include at least one of hafnium oxide, zirconium oxide, and hafnium-zirconium oxide.

At least one of the ferroelectrics and the antiferroelectrics may further include a dopant material. The dopant material may include at least one selected from the group consisting of or including C, Si, Ge, Sn, Pb, Al, Y, La, Gd, Mg, Ca, Sr, Ba, Ti, Zr, and Hf.

The ferroelectrics may include an orthorhombic crystal phase, e.g. may have atoms arranged in an orthorhombic crystal phase, and the antiferroelectrics may include a tetragonal crystal phase, e.g. may have atoms arranged in a tetragonal phase.

The ferroelectrics may be dispersed in the antiferroelectrics. The proportion of the ferroelectrics in the dielectric material may be greater than 0% and less than 40%.

A transition voltage at a point where a linear slope increases as a voltage increases in a charge (Q)-voltage (V) curve for the dielectric layer may be less than a transition voltage at a point where a linear slope increases as a voltage increases in a charge (Q)-voltage (V) curve for the antiferroelectrics.

Based on the transition voltage of the charge (Q)-voltage (V) curve for the dielectric layer, the linear slope may increase by about 7% or more.

Each of the first electrode and the second electrode may include at least one of a metal, a conductive metal nitride, and a conductive metal oxide.

According to some example embodiments, a semiconductor device includes a field effect transistor, and a capacitor device electrically connected to the field effect transistor. The capacitor device includes first and second electrodes spaced apart from each other, and a dielectric layer between the first electrode and the second electrode and including a dielectric material in which ferroelectrics and antiferroelectrics are mixed with each other.

Each of the ferroelectrics and the antiferroelectrics may include a fluorite-based oxide, i.e. a device having atoms arranged as in fluorite. The fluorite-based oxide may include at least one of hafnium oxide, zirconium oxide, and hafnium-zirconium oxide.

At least one of the ferroelectrics and the antiferroelectrics may further include a dopant material. The dopant material may include at least one selected from the group consisting of/including C, Si, Ge, Sn, Pb, Al, Y, La, Gd, Mg, Ca, Sr, Ba, Ti, Zr, and Hf.

The ferroelectrics may include atoms arranged in an orthorhombic crystal phase, and the antiferroelectrics may include atoms arranged in a tetragonal crystal phase.

The ferroelectrics may be dispersed in the antiferroelectrics. The proportion of the ferroelectrics in the dielectric material may be greater than 0% and less than 40%.

The field effect transistor may include a semiconductor layer including a source and a drain, a gate insulating layer provided on the semiconductor layer, and a gate electrode on the gate insulating layer.

According to some example embodiments, an electronic device including the semiconductor device described above is provided.

According to some example embodiments, a one-transistor, one-capacitor (1T1C) memory cell comprises an access transistor acting as the transistor in the 1T1C device, and a ferroelectric capacitor acting as the capacitor in the 1T1C device.

The ferroelectric capacitor has a nonlinear profile of voltage (V) vs. charge (Q), and the non-linear profile of the ferroelectric capacitor is based on antiferroelectric material and on ferroelectric material included in the ferroelectric capacitor.

The ferroelectric capacitor may include a dielectric layer, the dielectric layer including the antiferroelectric material and the ferroelectric material.

The access transistor may include a source node and a drain node, and one of the source node or the drain node may be connected to the ferroelectric capacitor.

The other of the source node or the drain node may be connected to a bit line.

The ferroelectric capacitor may include an electrode, and the one of the source node or the drain node may be connected to the ferroelectric electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
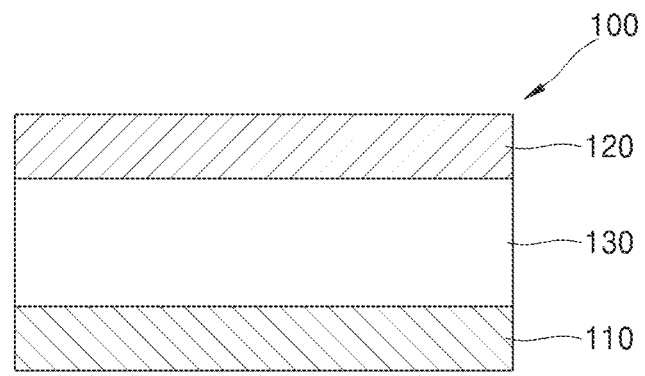
FIG. 1 illustrates a capacitor device according to some example embodiments.

Reference will now be made in detail to various embodiments, examples of which are illustrated in the accompanying drawings, wherein like reference numerals refer to like elements throughout. In this regard, some embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described with reference to the drawings. Like reference numerals denote like elements throughout, and in the drawings, sizes of elements may be exaggerated for clarity and convenience of explanation. Also, various embodiments described below are merely examples, and various modifications may be made from the variously described embodiments.

When a first element is "on ~" or "over" a second element, it may include a case where the first element contacts the second element and is directly located on the top, bottom, left, or right of the second element, and a case where the first element does not contact the second element and is located on the top, bottom, left, or right of the second element with a third element therebetween. The singular forms "a," "an," and "the" are intended to include the plural forms as well, unless the context clearly indicates otherwise. When a portion "includes" an element, another element may be further included, rather than excluding the existence of the other element, unless otherwise described.

The use of the terms "a" and "an," and "the" and similar referents in the context of describing example embodiments is to be construed to cover both the singular and the plural. The steps of all methods described herein may be performed in any suitable order unless otherwise indicated herein or otherwise clearly contradicted by context, and are not limited to the described order.

Also, the terms such as "unit" or "module" refer to units that perform at least one function or operation, and the units may be implemented as hardware or software or as a combination of hardware and software.

Also, lines or members connecting elements illustrated in the drawings are merely illustrative of functional connections and/or physical or circuit connections. In an actual device, the connections between components may be represented by various functional connections, physical connections, or circuit connections that are replaceable or added.

The use of any and all examples, or exemplary language provided herein, is intended merely to better describe the present disclosure and does not pose a limitation on the scope of the present disclosure unless otherwise claimed.

FIG. 1 illustrates a capacitor device 100 according to some example embodiments.

Referring to FIG. 1, the capacitor device 100 includes first and second electrodes 110 and 120 spaced apart from each other, and a dielectric layer 130 provided between the first electrode 110 and the second electrode 120. Thicknesses of the first and second electrodes 110 and 120 may be the same, or may be different from one another. Additionally or alternatively, a thickness of the dielectric layer 130 may be thinner than (or thicker than) that of either or both of the first and second electrodes 110 and 120. For example, in general as the dielectric layer 130 is thinner, a capacitance of the capacitor device 100 increases.

The first electrode 110 is a lower electrode and may be arranged on a substrate (not shown). The substrate may be a part of a structure supporting the capacitor device 100, or may be a part of another device connected to the capacitor device 100. The substrate may include a pattern of semiconductor material, a pattern of insulating material, and/or a pattern of conductive material. The substrate may include a semiconductor material such as one or more of silicon (Si), germanium (Ge), silicon germanium (SiGe), silicon carbide (SiC), gallium arsenide (GaAs), indium arsenide (InAs), or indium phosphide (InP), and/or may include an insulating material such as silicon oxide, silicon nitride, or silicon oxynitride. The second electrode 120 may be referred to as an upper electrode, and may be arranged to face the first electrode and spaced apart from the first electrode.

Each of the first and second electrodes 110 and 120 may include a metal, a conductive metal nitride, a conductive metal oxide, or a combination thereof. In this case, the metal may include, for example, ruthenium (Ru), titanium (Ti), tantalum (Ta), niobium (Nb), iridium (Ir), molybdenum (Mo), tungsten (W), or platinum (Pt). The conductive metal nitride may include, for example, one or more of titanium nitride (TiN), tantalum nitride (TaN), niobium nitride (NbN), molybdenum nitride (MoN), cobalt nitride (CoN), or tungsten nitride (WN). The conductive metal oxide may include, for example, one or more of platinum oxide (PtO), iridium oxide ($IrO_2$), ruthenium oxide ($RuO_2$), strontium ruthenium oxide ($SrRuO_3$), barium strontium ruthenium oxide (($Ba,Sr)RuO_3$), calcium ruthenium oxide ($CaRuO_3$), or lanthanum strontium cobalt oxide (($La,Sr)CoO_3$).

The first electrode 110 and the second electrode 120 may each independently have a single material layer or a stacked structure of a plurality of material layers. For example, one or both of the first electrode 110 and the second electrode 120 may each include a single layer of TiN or a single layer of NbN. For example, one or both of the first electrode 110 and the second electrode 120 may each have a stacked structure including a first electrode layer including TiN and a second electrode layer including NbN.

The dielectric layer 130 is provided between the first electrode 110 and the second electrode 120. In this case, the dielectric layer 130 may include a dielectric material in which ferroelectrics and antiferroelectrics are mixed with each other.

The ferroelectrics are materials that have spontaneous polarization by aligning their internal electric dipole moments even when an external electric field is not applied. The antiferroelectrics are materials that have dipoles that are alternating.

Figure 2A:
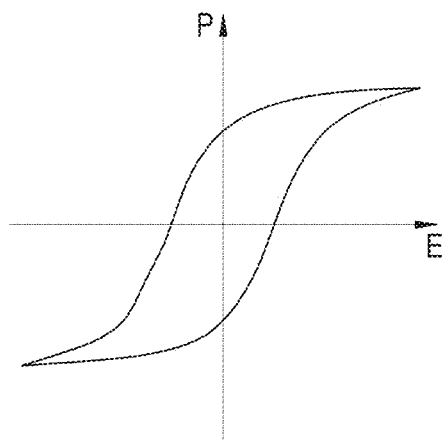
FIG. 2A is a schematic diagram showing a relationship between an electric field E applied to ferroelectrics and a polarization P thereof.
Figure 2B:
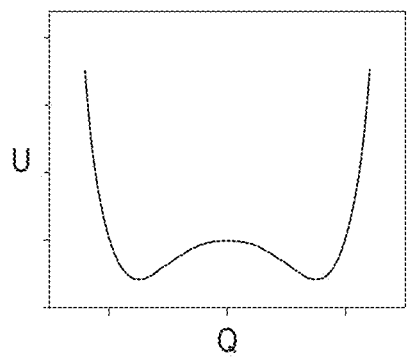
FIG. 2B is a schematic diagram showing a relationship between a charge Q of ferroelectrics and an energy U thereof.

FIG. 2A is a schematic diagram showing a relationship between an electric field E applied to ferroelectrics and a polarization P thereof. FIG. 2B is a schematic diagram showing a relationship between a charge Q of the ferroelectrics and an energy U of the ferroelectrics.

Referring to FIGS. 2A and 2B, a polarization value (or an electric field) in the material of the ferroelectrics remains semi-permanently even when a certain voltage is applied thereto and then the applied voltage is removed. In ferroelectrics, a polarization direction may be changed on a domain-by-domain basis by an external electric field. The charge Q-energy U graph of the ferroelectrics has two well shapes (two local minima) on left and right sides. The two well shapes correspond to two stable polarization states, and this graph shape means or describes hysteresis behavior.

The antiferroelectrics are materials that have no spontaneous polarization state in the absence of an electric field, but exhibit electrical properties similar to those of the ferroelectrics in the presence of an electric field greater than a certain size.

Figure 3A:
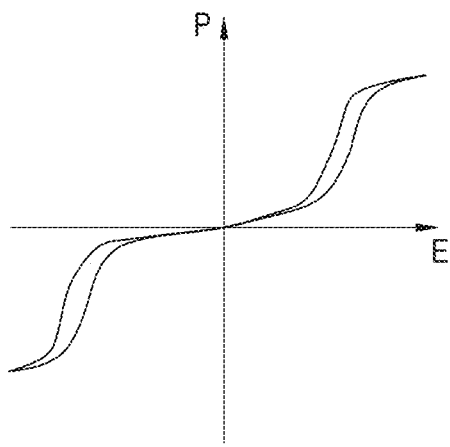
FIG. 3A is a schematic diagram showing a relationship between an electric field E applied to antiferroelectrics and a polarization P thereof.
Figure 3B:
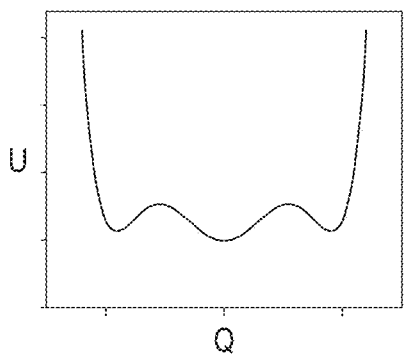
FIG. 3B is a schematic diagram showing a relationship between a charge Q of antiferroelectrics and an energy U thereof.

FIG. 3A is a schematic diagram showing a relationship between an electric field E applied to antiferroelectrics and a polarization P thereof. FIG. 3B is a schematic diagram showing a relationship between a charge Q of the antiferroelectrics and an energy U thereof.

Referring to FIGS. 3A and 3B, the antiferroelectrics have no spontaneous polarization, or have spontaneous polarization close to zero because, in the absence of an electric field, adjacent dipoles have opposite directions or there is no dipole. However, the antiferroelectrics may have spontaneous polarization like the ferroelectrics in the presence of an electric field having an intensity greater than a certain intensity, and the polarization direction may be changed in units of domains. The charge Q-energy U graph of the antiferroelectrics has a different curvature from that of the ferroelectrics.

Figure 4:
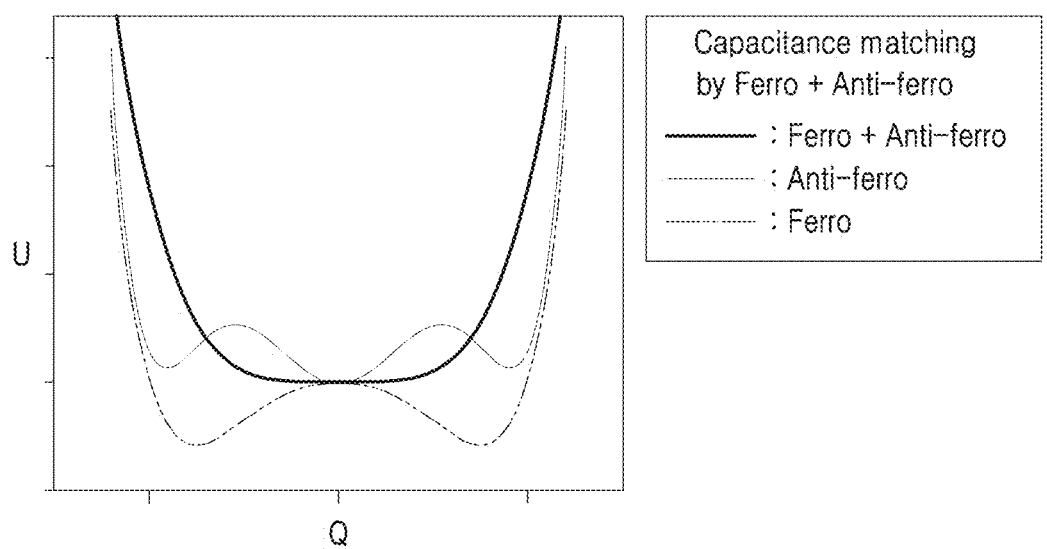
FIG. 4 is a graph conceptually showing capacitance matching using ferroelectrics and antiferroelectrics.

FIG. 4 is a graph conceptually showing capacitance matching using ferroelectrics and antiferroelectrics.

Referring to FIG. 4, capacitance matching may be performed using ferroelectrics and antiferroelectrics, and a charge (Q)-energy (U) graph may have a U-shape rather than a shape with two wells, and thus, hysteresis behavior may not be exhibited.

In some example embodiments, the dielectric layer 130 may include a dielectric material in which ferroelectrics and antiferroelectrics are mixed with each other, e.g. are mixed homogenously with each other. The ferroelectrics may be dispersed in the antiferroelectrics. The proportion of a volume occupied by the ferroelectrics in the dielectric material may be approximately greater than about 0% and less than about 40%. However, example embodiments are not necessarily limited thereto.

The ferroelectrics and the antiferroelectrics may be distinguished from each other according to one or more of a composition, a type and ratio of a dopant material, a crystal phase, and the like. For example, the ferroelectrics and the antiferroelectrics may be distinguished from each other according to a composition. Alternatively, even though the composition may be the same, the ferroelectrics and the antiferroelectrics may be distinguished from each other according to a crystal phase and/or a type and ratio of a dopant material. The type and content of each dopant material may be measured by various methods, for example, one or more of X-ray photoelectron spectroscopy (XPS), Auger electron spectroscopy (AES), and inductively coupled plasma (ICP).

The ferroelectrics may include an orthorhombic crystal phase/atoms arranged according to an orthorhombic crystal phase, and the antiferroelectrics may include a tetragonal crystal phase/atoms arranged according to a tetragonal phase. Such a crystal phase may be identified by various methods, for example, one or more of transmission electron microscopy (TEM) and grazing incidence X-ray diffraction (GIXRD).

The ferroelectrics and the antiferroelectrics may each include a fluorite-based oxide, that is, an oxide arranged as in fluorite. As used herein a "fluorite-based oxide" may or may not include fluorine, and may have a motif as $MX_2$. Here, M is a metal, and X may be ions that are arranged interstitially. The motif may have a face-centered cubic structure. For example, the ferroelectrics and the antiferroelectrics may each include at least one of hafnium oxide, zirconium oxide, and hafnium-zirconium oxide.

A hafnium element content of the ferroelectrics may be greater than a hafnium element content of the antiferroelectrics. Additionally or alternatively, a zirconium element content of the ferroelectrics may be greater than a zirconium element content of the antiferroelectrics. The ferroelectrics may include hafnium-zirconium oxide expressed as $Hf_xZr_{1-x}O_2$ ($0.2 \leq x < 1.0$). In this case, the antiferroelectrics may include hafnium-zirconium oxide expressed as $Hf_xZr_{1-x}O_2$ ($0 < x < 0.2$) or zirconium oxide.

At least one of the ferroelectrics and the antiferroelectrics may further include a dopant material. The dopant material may include, for example, at least one selected from the group consisting of or including C, Si, Ge, Sn, Pb, Al, Y, La, Gd, Mg, Ca, Sr, Ba, Ti, Zr, and Hf. In this case, a dopant material content of the ferroelectrics may be less than a dopant material content of the antiferroelectrics.

The dielectric layer 130 including the ferroelectrics and the antiferroelectrics may be formed by, for example, being deposited on the first electrode 110 and/or the second electrode 120 by atomic layer deposition (ALD). The ferroelectrics and the antiferroelectrics may be deposited simultaneously or concurrently; however, example embodiments are not limited thereto. The ferroelectrics may be dispersed within the antiferroelectrics, and/or the antiferroelectrics may be dispersed within the ferroelectrics; however, example embodiments are not limited thereto.

In some example embodiments, by forming the dielectric layer 130 in a structure in which ferroelectrics and antiferroelectrics are mixed with each other, e.g. are mixed homogenously with each other, an electric field value for polarization inversion decreases, and the dispersion of the electric field value increases. Accordingly, domains causing polarization inversion are present even in a small operating voltage range, resulting in a nonlinear charge Q-voltage V characteristic as described below. As a result, as the voltage increases, the slope of a charge Q-voltage V characteristic curve increases, and thus, more charges may be charged and discharged, as compared to a capacitor device exhibiting a linear charge Q-voltage V characteristic. Such a capacitor may have non-linear, such as quadratic, behavior.

Hereinafter, the characteristics of a capacitor device according to some example embodiments, which includes antiferroelectrics and ferroelectrics, the characteristics of a capacitor device including antiferroelectrics, and the characteristics of a capacitor device including ferroelectrics will be compared with each other and described.

In FIGS. 5 to 10, "AFE+FE" denotes the capacitor device according to the embodiment, which includes antiferroelectrics and ferroelectrics, "AFE" denotes the capacitor device including antiferroelectrics, and "FE" denotes the capacitor device including ferroelectrics. In the capacitor device according to the embodiment, the ratio of ferroelectrics included in a dielectric layer is approximately 20%.

Figure 5:
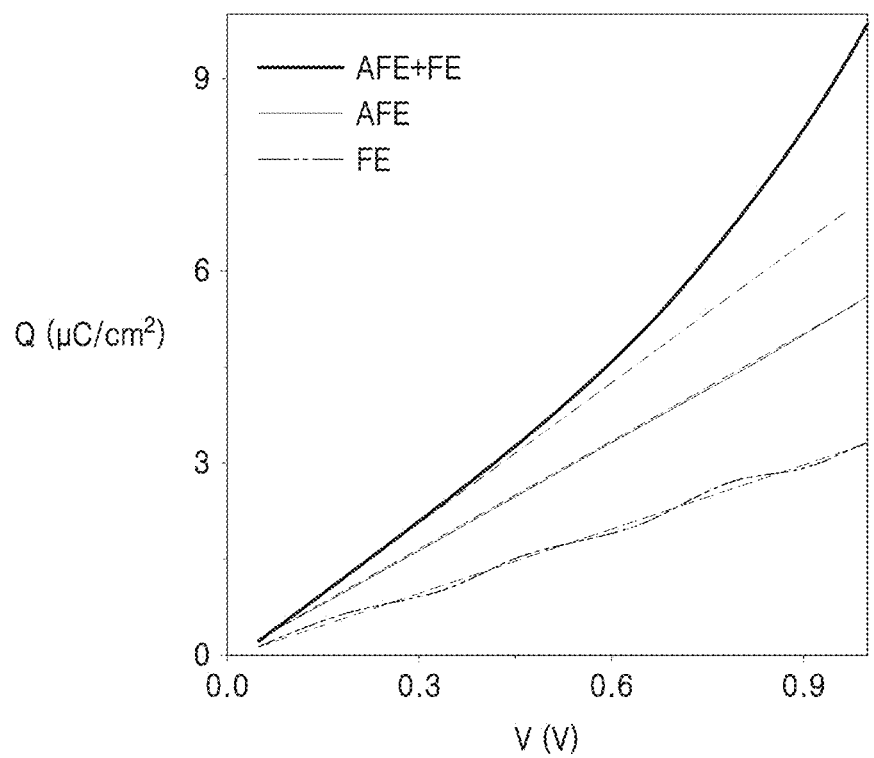
FIG. 5 illustrates reversible charge Q-voltage V characteristics measured in a voltage range of 0V to 1.0V for a capacitor device according to some example embodiments, which includes antiferroelectrics and ferroelectrics, a capacitor device including antiferroelectrics, and a capacitor device including ferroelectrics.
Figure 6:
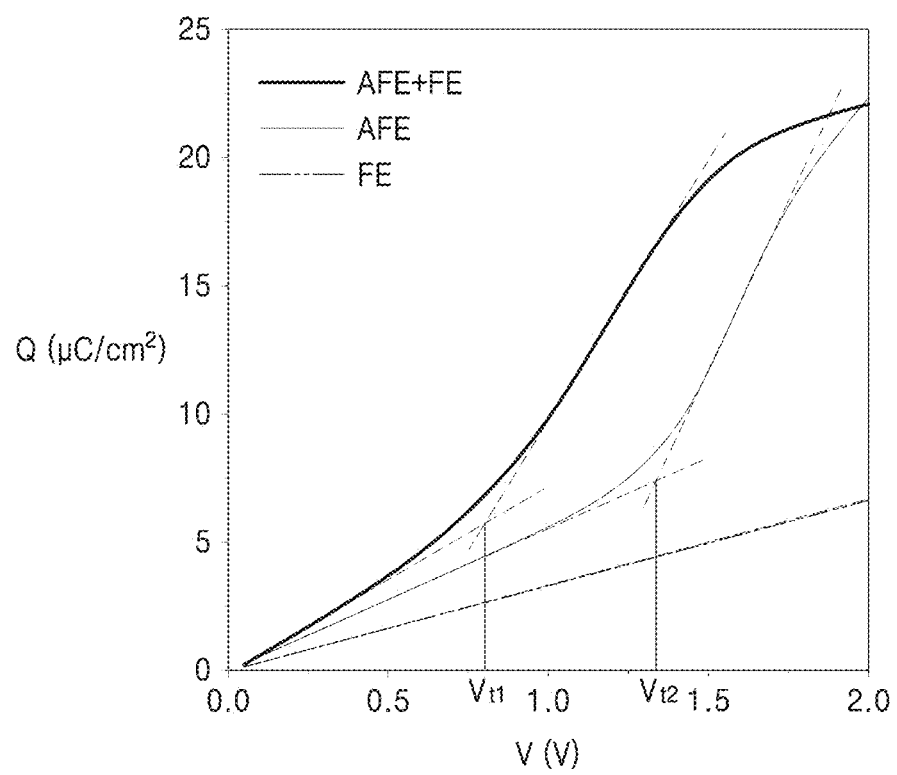
FIG. 6 illustrates reversible charge Q-voltage V characteristics measured in a voltage range of 0V to 2.0V for a capacitor device according to the embodiment, which includes antiferroelectrics and ferroelectrics, a capacitor device including antiferroelectrics, and a capacitor device including ferroelectrics.

FIG. 5 illustrates reversible charge Q-voltage V characteristics measured in a voltage range of 0V to 1.0V for the capacitor device according to the embodiment, which includes antiferroelectrics and ferroelectrics, the capacitor device including antiferroelectrics, and the capacitor device including ferroelectrics. FIG. 6 illustrates reversible charge Q-voltage V characteristics measured in a voltage range of 0V to 2.0V for the capacitor device according to the embodiment, which includes antiferroelectrics and ferroelectrics, the capacitor device including antiferroelectrics, and the capacitor device including ferroelectrics. FIGS. 5 and 6 illustrate results of measuring charges discharged during charging and discharging according to a charging voltage by using an incremental square pulse.

Referring to FIG. 5, in a small voltage range of 0V to 1.0V, each of the capacitor device including antiferroelectrics and the capacitor device including ferroelectrics exhibits a linear charge Q-voltage V characteristic. In contrast, the capacitor device according to the embodiment, which includes antiferroelectrics and ferroelectrics, exhibits a nonlinear charge Q-voltage V characteristic, such as a quadratic Q-V characteristic.

Referring to FIG. 6, in a larger voltage range of 0V to 2.0V, the capacitor device including ferroelectrics exhibits a linear charge Q-voltage V characteristic. In addition, each of the capacitor device including antiferroelectric, and the capacitor device according to various example embodiment, which includes antiferroelectrics and ferroelectrics, exhibits a nonlinear charge Q-voltage V characteristic, e.g. exhibits a profile corresponding to a sigmoid-shaped characteristic.

In FIG. 6, "$V_{t1}$" denotes a first transition voltage at a point where a linear slope sharply increases as the voltage increases in a charge Q-voltage V characteristic curve of the capacitor device according to the embodiment, which includes antiferroelectrics and ferroelectrics. In this case, the linear slope may increase by about 7% or more based on the first transition voltage. "$V_{t2}$" denotes a second transition voltage at a point where a linear slope sharply increases as the voltage increases in a charge Q-voltage V characteristic curve of the capacitor device including antiferroelectrics. The above-described first and second transition voltages may be defined as voltages at which nonlinear characteristics are increased/maximized in the charge Q-voltage V characteristic curve.

As shown in FIG. 6, the first transition voltage $V_{t1}$ of the capacitor device according to some example embodiments, which includes antiferroelectrics and ferroelectrics, is lower than the second transition voltage $V_{t2}$ of the capacitor device including antiferroelectrics.

Figure 7:
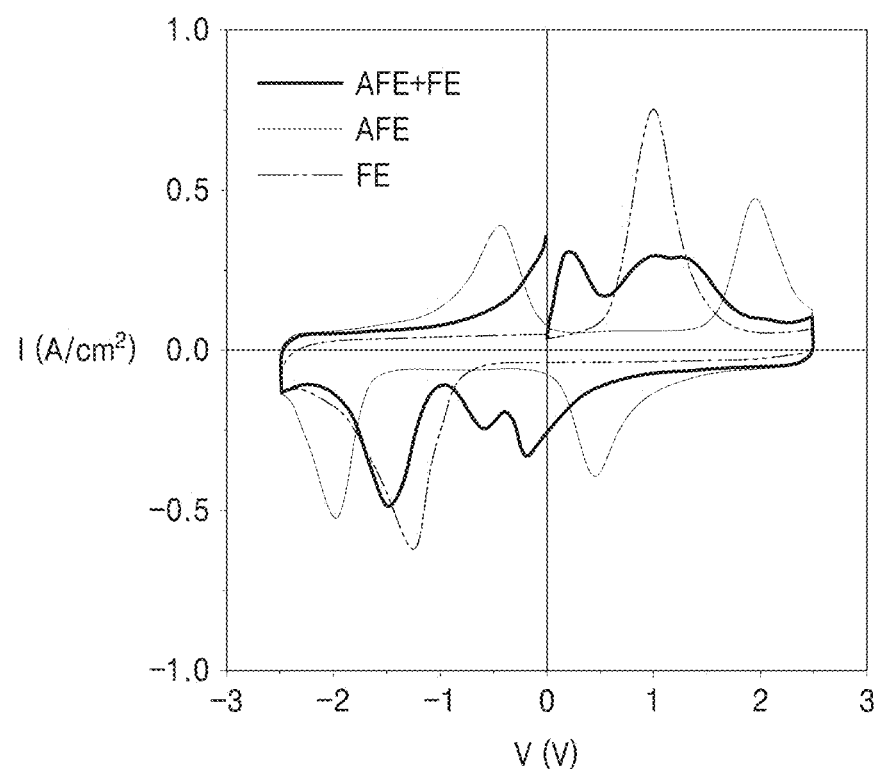
FIG. 7 illustrates transient current I-voltage V characteristics measured in a voltage range of −3V to +3V for a capacitor device according to the embodiment, which includes antiferroelectrics and ferroelectrics, a capacitor device including antiferroelectrics, and a capacitor device including ferroelectrics.

FIG. 7 illustrates transient current I-voltage V characteristics measured in a voltage range of −3V to +3V for the capacitor device according to some example embodiments, which includes antiferroelectrics and ferroelectrics, the capacitor device including antiferroelectrics, and the capacitor device including ferroelectrics. FIG. 7 illustrates results of measuring transient current by using a triangular pulse.

Referring to FIG. 7, in the capacitor device according to some example embodiments, which includes antiferroelectrics and ferroelectrics, two current peaks occurred at a positive (+) current, and one of the two current peaks appears near 0V. On the other hand, at the positive (+) current, one current peak occurred in the capacitor device including ferroelectrics, and two current peaks occurred in the capacitor device including antiferroelectric.

Figure 8:
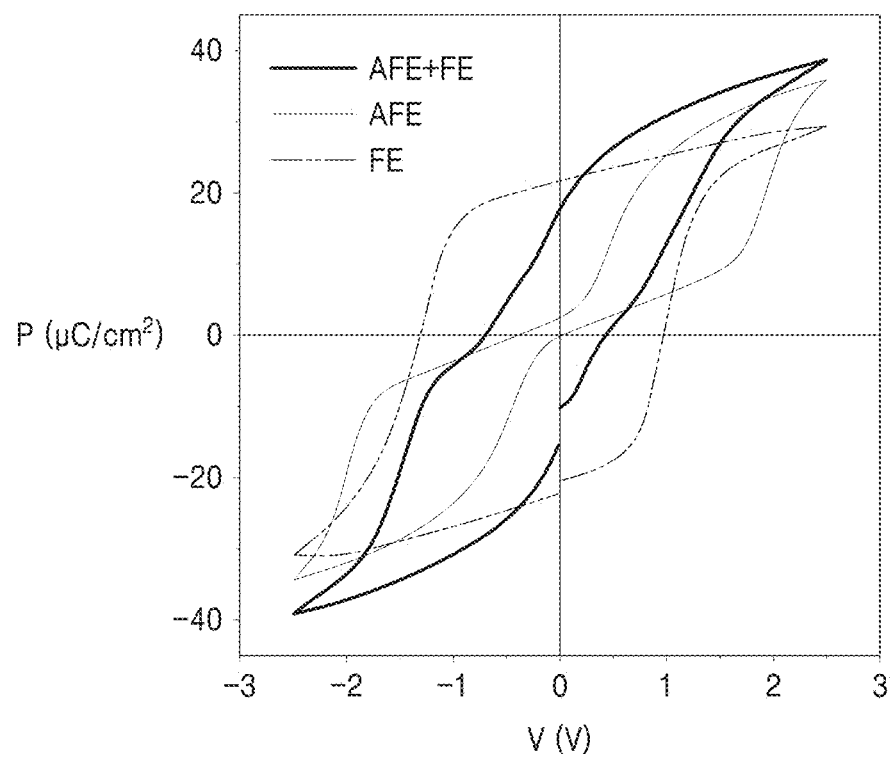
FIG. 8 illustrates polarization P-voltage V characteristics measured in a voltage range of −3V to +3V for a capacitor device according to the embodiment, which includes antiferroelectrics and ferroelectrics, a capacitor device including antiferroelectrics, and a capacitor device including ferroelectrics.

FIG. 8 illustrates polarization P-voltage V characteristics measured in a voltage range of −3V to +3V for the capacitor device according to some example embodiments, which includes antiferroelectrics and ferroelectrics, the capacitor device including antiferroelectrics, and the capacitor device including ferroelectrics. FIG. 8 illustrates polarization P-voltage V characteristics obtained by integrating the transient current with time in FIG. 7.

Referring to FIG. 8, the capacitor device including ferroelectrics has a square-hysteresis at an origin, and has two hysteresis in polarity with respect to the origin. In addition, the capacitor device according to the embodiment, which includes antiferroelectrics and ferroelectrics, has pinched hysteresis close to the middle between the capacitor device including ferroelectrics and the capacitor device including antiferroelectrics.

Figure 9:
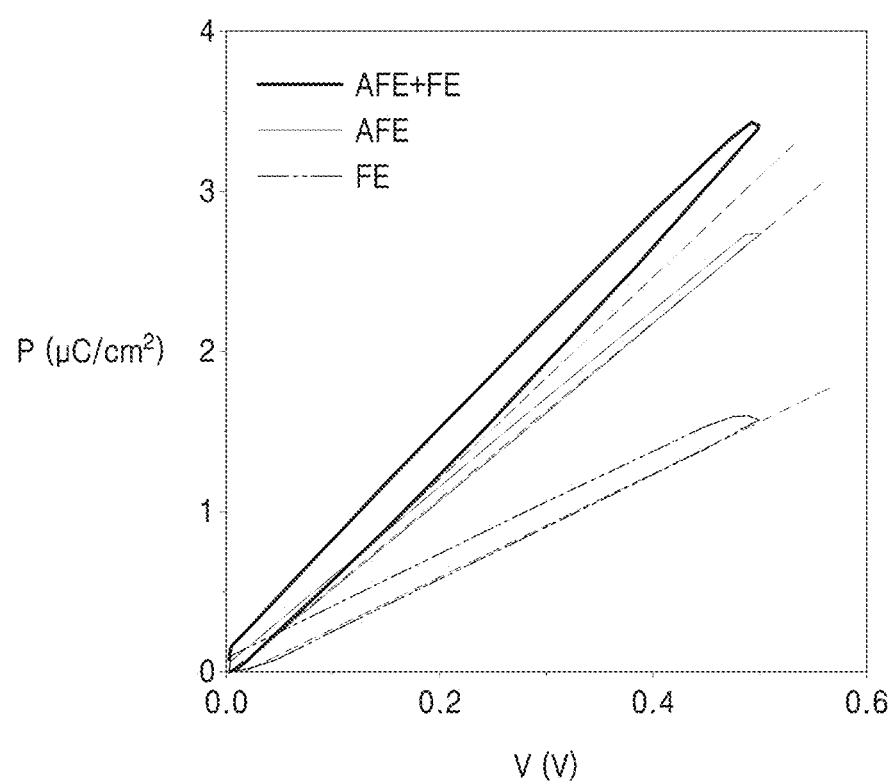
FIG. 9 illustrates polarization P-voltage V characteristics measured in a voltage range of 0V to 0.6V for a capacitor device according to the embodiment, which includes antiferroelectrics and ferroelectrics, a capacitor device including antiferroelectrics, and a capacitor device including ferroelectrics.

FIG. 9 illustrates polarization P-voltage V characteristics measured in a voltage range of 0V to 0.6V for the capacitor device according to some example embodiments, which includes antiferroelectrics and ferroelectrics, the capacitor device including antiferroelectrics, and the capacitor device including ferroelectrics. FIG. 9 illustrates results of measuring dynamic hysteresis by using a triangular pulse.

Referring to FIG. 9, in a small voltage range of 0V to 0.6V, the capacitor device according to the embodiment, which includes antiferroelectrics and ferroelectrics, exhibits a nonlinear polarization P-voltage V characteristic, unlike the capacitor device including ferroelectrics and the capacitor device including antiferroelectrics.

Figure 10:
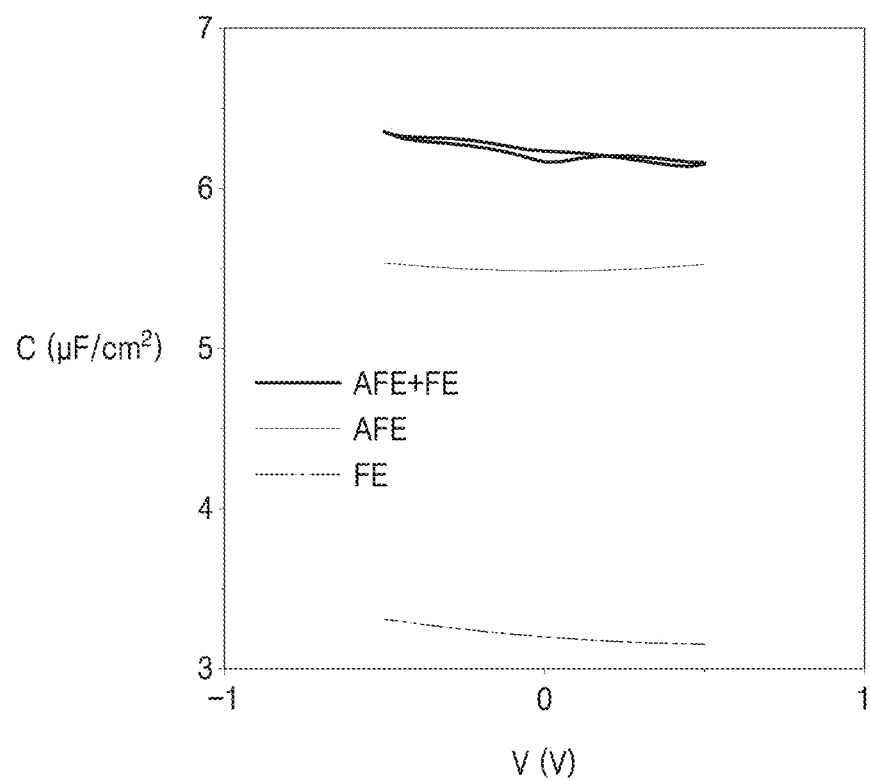
FIG. 10 illustrates capacitance C-voltage V characteristics measured in a voltage range of −1V to +1V for a capacitor device according to the embodiment, which includes antiferroelectrics and ferroelectrics, a capacitor device including antiferroelectrics, and a capacitor device including ferroelectrics.

FIG. 10 illustrates capacitance C-voltage V characteristics measured in a voltage range of −1V to +1V for the capacitor device according to some example embodiments, which includes antiferroelectrics and ferroelectrics, the capacitor device including antiferroelectrics, and the capacitor device including ferroelectrics. FIG. 10 illustrates results of measuring capacitance C-voltage V through a small alternating current (AC) signal.

Referring to FIG. 10, the capacitor device according to some example embodiments, which includes antiferroelectrics and ferroelectrics, exhibits a larger capacitance than the capacitor device including ferroelectrics and the capacitor device including antiferroelectrics. On the other hand, in a voltage range of −1V to +1V, the capacitor device including ferroelectrics and the capacitor device including antiferroelectrics do not show hysteresis.

According to another aspect, a semiconductor device including the capacitor device 100 described above may be provided. This semiconductor device may have a memory characteristic, and may be or may include, for example, a dynamic random access memory (DRAM). The DRAM device may be or may include a plurality of 1T1C cells, wherein each of the cells include a capacitor having a dielectric wherein both ferroelectrics and antiferroelectrics are mixed. The DRAM may have volatile characteristics, and/or may have non-volatile characteristics. In addition, the semiconductor device may include a structure in which the aforementioned capacitor device and a field effect transistor are electrically connected to each other.

Figure 11:
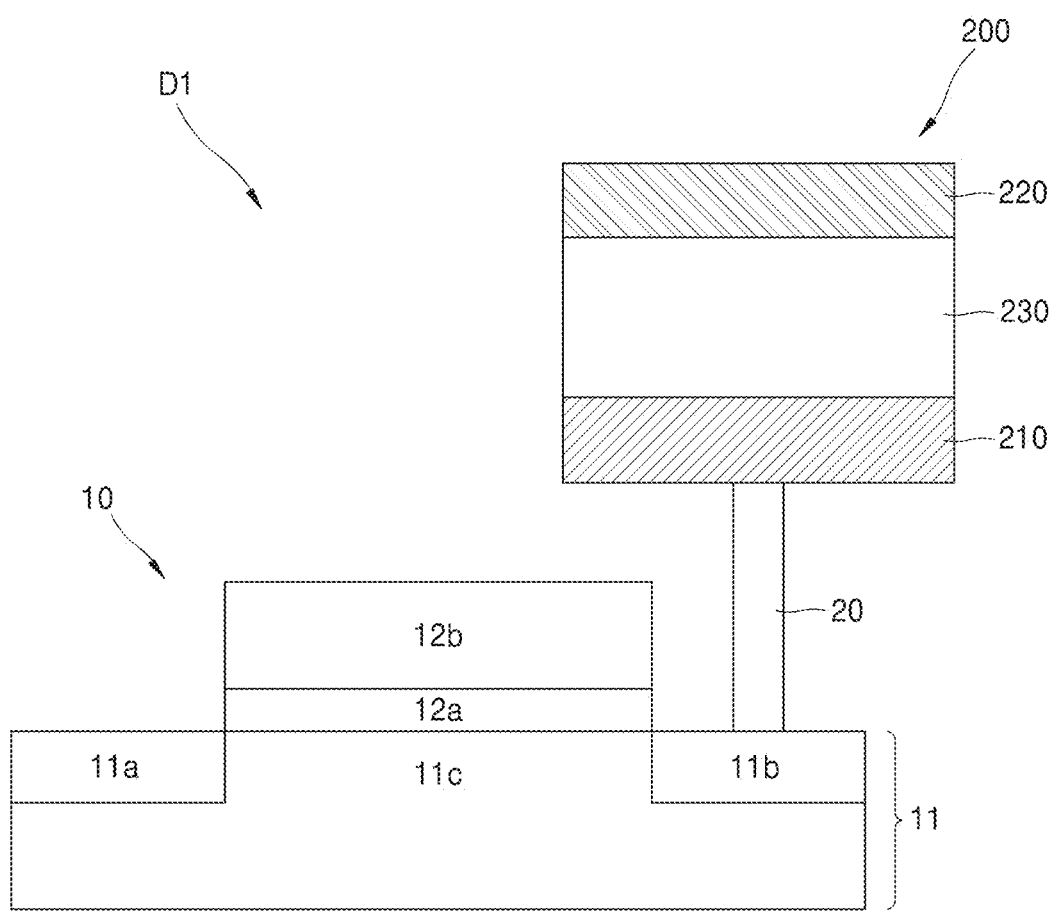
FIG. 11 illustrates a semiconductor device according to some example embodiments.

FIG. 11 illustrates a semiconductor device D1 according to some example embodiments.

Referring to FIG. 11, the semiconductor device D1 may include a structure in which a capacitor device 200 and a field effect transistor 10 are electrically connected to each other by a contact 20. The capacitor device 200 includes a first electrode 210, a second electrode 220, and a dielectric layer 230 provided between the first electrode 210 and the second electrode 220. The capacitor device 200 may be or may include the capacitor device 100 in FIG. 1, and because this has been described above, detailed descriptions thereof are omitted.

The field effect transistor 10 may include a substrate 11 and a gate electrode 12b provided on the substrate 11. A gate insulating layer 12a may be further provided between the substrate 11 and the gate electrode 12b. The field effect transistor 10 may be planar, or may have a three-dimensional structure; however, example embodiments are not limited thereto.

The substrate 11 may include a source 11a, a drain 11b, and a channel 11c that is electrically connected to the source 11a and the drain 11b. The source 11a may be electrically connected to or contacted with one end of the channel 11c, and the drain 11b may be electrically connected or contacted with the other end of the channel 11c. The channel 11c may be defined as a substrate region between the source 11a and the drain 11b in the substrate 11.

The substrate 11 may include a semiconductor material. The substrate 11 may include a semiconductor material such as Si, Ge, SiGe, SiC, GaAs, InAs, or InP. Also, the substrate 11 may include a silicon on insulator (SOI) substrate.

The source 11a, the drain 11b, and the channel 11c may be each independently or at least partially simultaneously formed by implanting impurities, such as at least one of boron, phosphorus, or arsenic, into different regions of the substrate 11. In this case, the source 11a, the channel 11c, and the drain 11b may include a substrate material as a base material. Alternatively or additionally, one or more of the source 11a and the drain 11b may include a conductive material. In this case, the source 11 and the drain 11b may each include, for example, one or more of a metal, a metal compound, or a conductive polymer.

The channel 11c may be implemented as a separate material layer (a thin film) (not shown). In this case, for example, the channel 11c may include at least one of Si, Ge, SiGe, a III-V group semiconductor, an oxide semiconductor, a nitride semiconductor, an oxynitride semiconductor, a two-dimensional material, quantum dots, and an organic semiconductor. For example, the oxide semiconductor may include InGaZnO or the like, the two-dimensional material may include transition metal dichalcogenide (TMD) and/or graphene, and the quantum dots may include colloidal quantum dots (QDs) and/or nanocrystal structures.

The gate electrode 12b may be arranged on the substrate 11 to face the channel 11c while being apart from the substrate 11. The gate electrode 12b may include at least one of metal, metal nitride, metal carbide, and polysilicon such as doped polysilicon. For example, the metal may include at least one of aluminum (Al), tungsten (W), molybdenum (Mo), titanium (Ti), and tantalum (Ta), and the metal nitride may include at least one of titanium nitride (TiN) and tantalum nitride (TaN). The metal carbide may include at least one of aluminum-doped (or contained) metal carbide and silicon-doped (or contained) metal carbide. As a specific example, the metal carbide may include one or more of TiAlC, TaAlC, TiSiC, or TaSiC.

The gate electrode 12b may have a structure in which a plurality of materials are stacked. For example, the gate electrode 12b may have a stacked structure of a metal nitride layer/metal layer such as TiN/Al, or a stacked structure of a metal nitride layer/metal carbide layer/metal layer such as TiN/TiAlC/W. However, the materials mentioned above are merely examples.

The gate insulating layer 12a may be further arranged between the substrate 11 and the gate electrode 12b. The gate insulating layer 12a may include a paraelectric material and/or a high-k dielectric material, and may have a dielectric constant of about 20 to about 70.

The gate insulating layer 12a may include one or more of silicon oxide, silicon nitride, aluminum oxide, hafnium oxide, zirconium oxide, or the like, and/or may include a two-dimensional insulator such as hexagonal boron nitride (h-BN). For example, the gate insulating layer 12a may include one or more of silicon oxide ($SiO_2$), silicon nitride ($SiN_x$), or the like, or may include hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), hafnium zirconium oxide ($HfZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}Ta_{0.5}O_3$), red zinc niobate ($PbZnNbO_3$), or the like. In addition, the gate insulating layer 12a may include a metal nitride oxide such as one or more of aluminum oxynitride (AlON), zirconium oxynitride (ZrON), hafnium oxynitride (HfON), lanthanum oxynitride (LaON), or yttrium oxynitride (YON), a silicate such as ZrSiON, HfSiON, YSiON, or LaSiON, or an aluminate such as ZrAlON or HfAlON. The gate insulating layer 12a may constitute a gate stack together with the gate electrode 12b.

One of the first electrode 210 and the second electrode 220 of the capacitor device 200 and one of the source 11a and the drain 11b of the field effect transistor 10 may be electrically connected to each other by the contact 20. In this case, the contact 20 may include a suitable conductive material, for example, one or more of tungsten, copper, aluminum, or polysilicon such as doped polysilicon.

The arrangement of the capacitor device 200 and the field effect transistor 10 may be variously modified. For example, the capacitor device 200 may be arranged on the substrate 11 or may have a structure embedded in the substrate 11. Although FIG. 11 illustrates a semiconductor device D1 including one capacitor device 200 and one field effect transistor 10, as described below, a semiconductor device D10 including a plurality of capacitor devices and a plurality of field effect transistors may be implemented.

Figure 12:
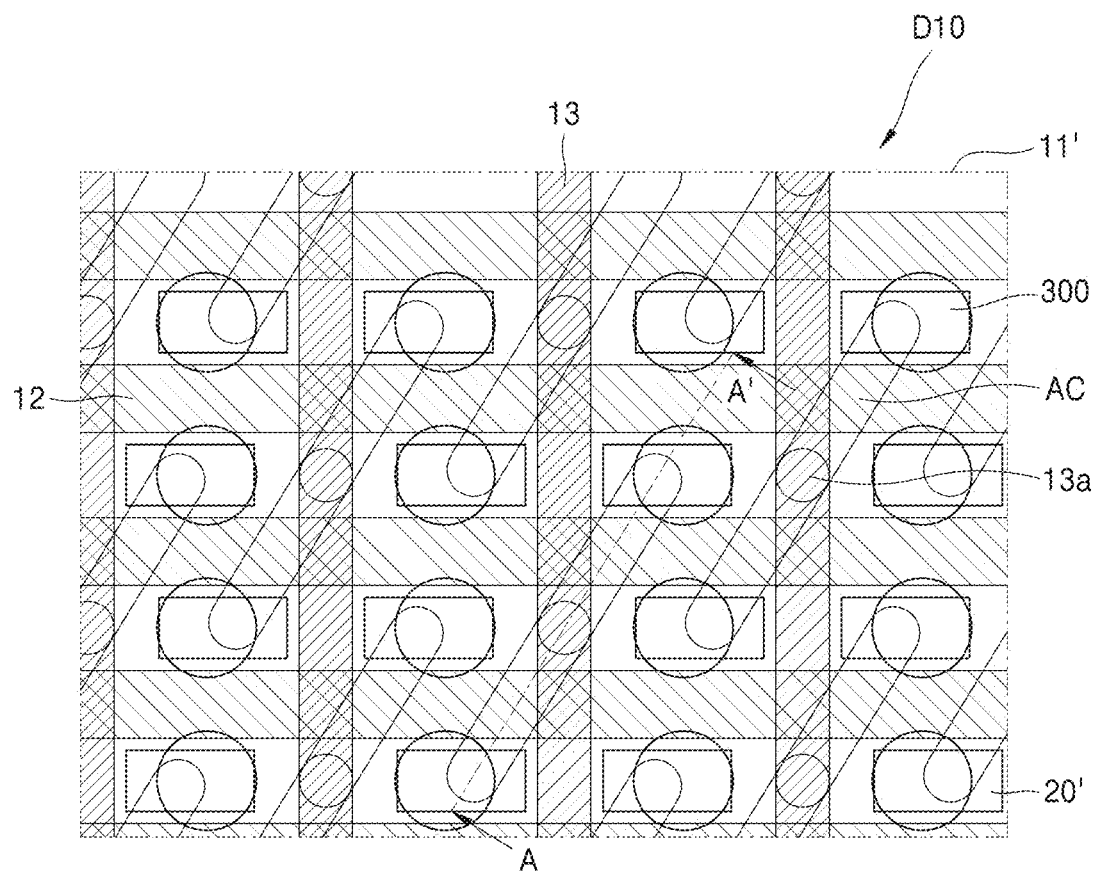
FIG. 12 is a plan view of a semiconductor device according to another embodiment.

FIG. 12 is a plan view of a semiconductor device D10 according to some example embodiments.

Referring to FIG. 12, the semiconductor device D10 may include a structure in which a plurality of capacitor devices 300 and a plurality of field effect transistors are repeatedly arranged. The semiconductor device D10 may include a field effect transistor including a substrate 11', which includes a source, a drain, and a channel, and a gate stack 12, a contact structure 20' arranged on the substrate 11' so as not to overlap the gate stack 12, and a capacitor device 300 arranged on the contact structure 20'. The semiconductor device D10 may further include a bit line structure 13 electrically connecting a plurality of field effect transistors.

FIG. 12 illustrates the semiconductor device D10 in which both the contact structure 20' and the capacitor device 300 are repeatedly arranged in X and Y directions. However, example embodiments are not limited thereto. For example, the contact structure 20' may be arranged in the X and Y directions, and the capacitor device 300 may be arranged in a hexagonal shape such as a honeycomb structure.

Figure 13:
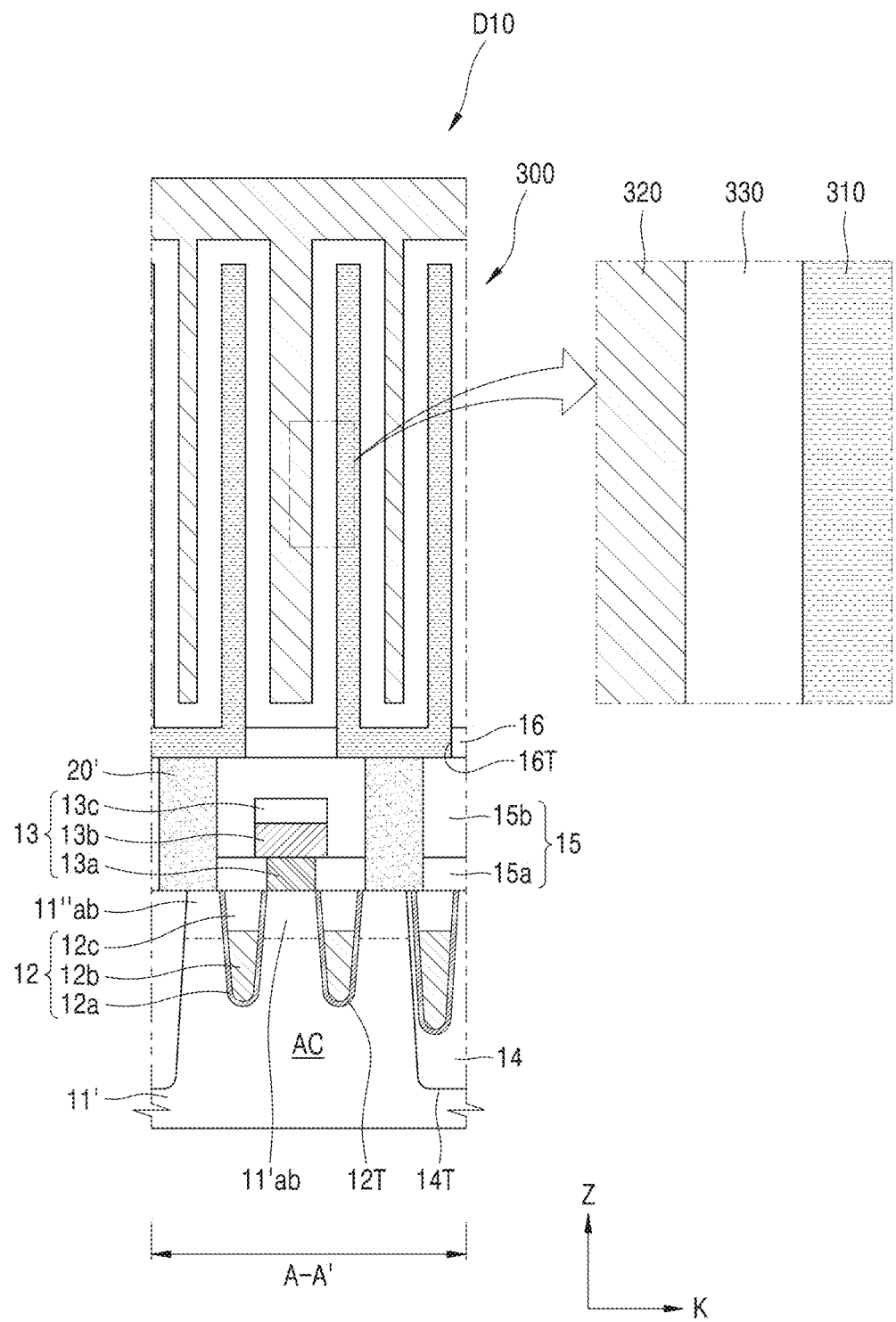
FIG. 13 is a cross-sectional view of the semiconductor device taken along line A-A' of FIG. 12.

FIG. 13 is a cross-sectional view of the semiconductor device D10 taken along line A-A' of FIG. 12.

Referring to FIG. 13, the substrate 11' may have a shallow trench isolation (STI) structure including a device isolation layer 14. The device isolation layer 14 may be a single layer including one type of insulating layer, or a multilayer including a combination of two or more types of insulating layers. The device isolation layer 14 may include a device isolation trench 14T in the substrate 11', and the device isolation trench 14T may be filled with an insulating material. The insulation material may include at least one of fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), and tonen silazene (TOSZ), but is not limited thereto.

The substrate 11' may further include an active region AC defined by the device isolation layer 14, and a gate line trench 12T parallel to the upper surface of the substrate 11' and arranged to extend in the X direction. The active region AC may have a relatively long island shape having a minor axis and a major axis. The major axis of the active region AC may be arranged along a K direction parallel to the upper surface of the substrate 11', as illustrated in FIG. 12.

The gate line trench 12T may be arranged to cross the active region AC at a certain depth from the upper surface of the substrate 11' or may be arranged in the active region AC. The gate line trench 12T may also be arranged inside the device isolation trench 14T, and the gate line trench 12T inside the device isolation trench 14T may have a lower bottom than the gate line trench 12T of the active region AC. A first source/drain 11'ab and a second source/drain 11"ab may be arranged in an upper portion of the active region AC positioned on both sides of the gate line trench 12T.

The gate stack 12 may be arranged inside the gate line trench 12T. Specifically, the gate insulating layer 12a, the gate electrode 12b, and a gate capping layer 12c may be sequentially arranged inside the gate line trench 12T. The gate insulating layer 12a and the gate electrode 12b may refer to the above description, and the gate capping layer 12c may include at least one of silicon oxide, silicon oxynitride, and silicon nitride. The gate capping layer 12c may be arranged on the gate electrode 12b to fill the remaining portion of the gate line trench 12T.

The bit line structure 13 may be arranged on the first source/drain 11'ab. The bit line structure 13 may be arranged to be parallel to the upper surface of the substrate 11' and extend in the Y direction. The bit line structure 13 may be electrically connected to the first source/drain 11'ab, and may sequentially include a bit line contact 13a, a bit line 13b, and a bit line capping layer 13c on a substrate. For example, the bit line contact 13a may include polysilicon, the bit line 13b may include a metal material, and the bit line capping layer 13c may include an insulating material such as silicon nitride or silicon oxynitride.

FIG. 13 illustrates a case in which the bit line contact 13a has a bottom surface at the same level as the upper surface of the substrate 11'. However, the bit line contact 13a may extend from the upper surface of the substrate 11' to the inside of a recess (not shown) formed to a certain depth, and thus, the bottom surface of the bit line contact 13a may be lower than the upper surface of the substrate 11'.

The bit line structure 13 may further include a bit line intermediate layer (not shown) between the bit line contact 13a and the bit line 13b. The bit line intermediate layer may include a metal silicide such as tungsten silicide, or a metal nitride such as tungsten nitride. In addition, a bit line spacer (not shown) may be further formed on a sidewall of the bit line structure 13. The bit line spacer may have a single-layer structure or a multi-layer structure, and may include an insulating material such as silicon oxide, silicon oxynitride, or silicon nitride. In addition, the bit line spacer may further include an air space (not shown).

The contact structure 20' may be arranged on the second source/drain 11"ab. The contact structure 20' and the bit line structure 13 may be arranged on different sources/drains on the substrate 11'. The contact structure 20' may have a structure in which a lower contact pattern (not shown), a metal silicide layer (not shown), and an upper contact pattern (not shown) are sequentially stacked on the second source/drain 11"ab. The contact structure 20' may further include a barrier layer (not shown) surrounding the side surface and the bottom surface of the upper contact pattern. For example, the lower contact pattern may include polysilicon, the upper contact pattern may include a metal material, and the barrier layer may include a conductive metal nitride.

The capacitor device 300 may be electrically connected to the contact structure 20' and arranged on the substrate 11'.

Specifically, the capacitor device 300 may include a first electrode 310 electrically connected to the contact structure 20', a dielectric layer 330 arranged on the first electrode 310, and a second electrode 320 arranged on the dielectric layer 330. The dielectric layer 330 may be arranged on the first electrode 310 to be parallel to the surface of the first electrode 310. Because the first electrode 310, the dielectric layer 330, and the second electrode 320 of the capacitor device 300 have been described above, descriptions thereof are omitted.

An interlayer insulating layer 15 may be further arranged between the capacitor device 300 and the substrate 11'. The interlayer insulating layer 15 may be arranged in a space between the capacitor device 300 and the substrate 11', in which other structures are not arranged. Specifically, the interlayer insulating layer 15 may be arranged to cover wiring lines and/or electrode structures, such as the bit line structure 13, the contact structure 20', and the gate stack 12 on the substrate 11'. For example, the interlayer insulating layer 15 may surround the wall of the contact structure 20'. The interlayer insulating layer 15 may include a first interlayer insulating layer 15a surrounding the bit line contact 13a, and a second interlayer insulating layer 15b covering side surfaces and/or upper surfaces of the bit line 13b and the bit line capping layer 13c.

The first electrode 310 of the capacitor device 300 may be arranged on the interlayer insulating layer 15, specifically, on the second interlayer insulating layer 15b. Also, when a plurality of capacitor devices 300 are arranged, the bottom surfaces of a plurality of first electrodes 310 may be separated by an etch stop layer 16. In other words, the etch stop layer 16 may include an opening 16T, and the bottom surface of the first electrode 310 of the capacitor device 500 may be arranged in the opening 16T.

Figure 14:
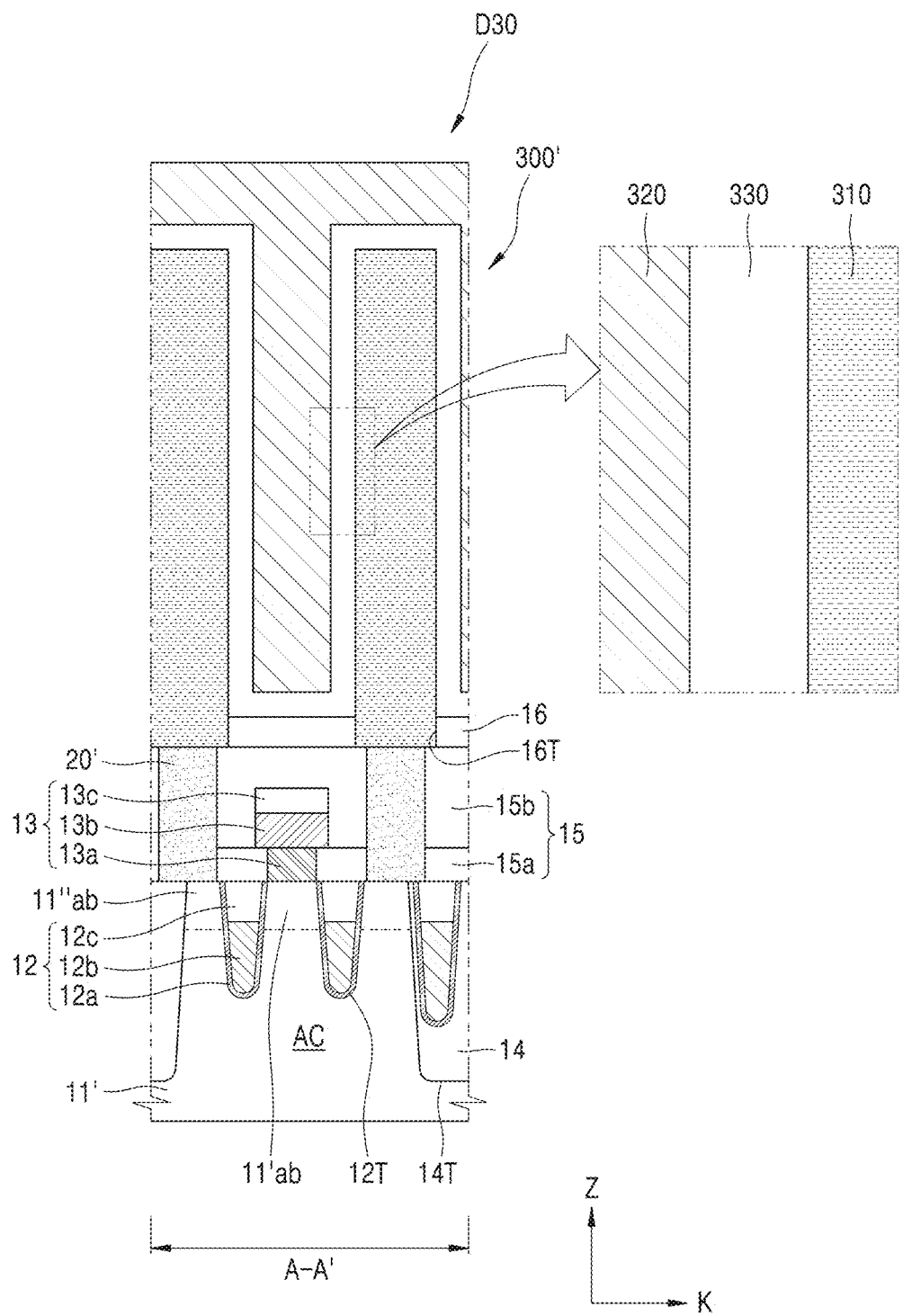
FIG. 14 is a cross-sectional view of a semiconductor device according to another embodiment.

The first electrode 310 may have a cylinder shape or cup shape with a closed bottom, as shown in FIG. 13. As another example, as in a semiconductor device D30 shown in FIG. 14, a first electrode 310 of a capacitor device 300' may have a pillar shape such as a cylinder, a square pillar, or a polygonal pillar, which extends in a vertical direction (i.e., a Z direction). Each of the capacitor devices 300 and 300' may further include a support portion (not shown) that prevents the first electrode 310 from being tilted or collapsed, and the support portion may be arranged on a sidewall of the first electrode 310.

The capacitor device or the semiconductor device according to the above-described example embodiments may be applied to various application fields. For example, the capacitor device or the semiconductor device according to various embodiments may be applied to a logic device or a memory device. In addition, the capacitor device according to various embodiments may be used for one or more of an arithmetic operation, program execution, temporary data retention, etc. in devices such as a mobile device, a computer, a notebook computer, a sensor, a network device, and a neuromorphic device. Alternatively or additionally, the capacitor device or the semiconductor device according to various embodiments may be useful for a device in which a data transmission amount is large and data transmission is continuously performed.

Figure 15:
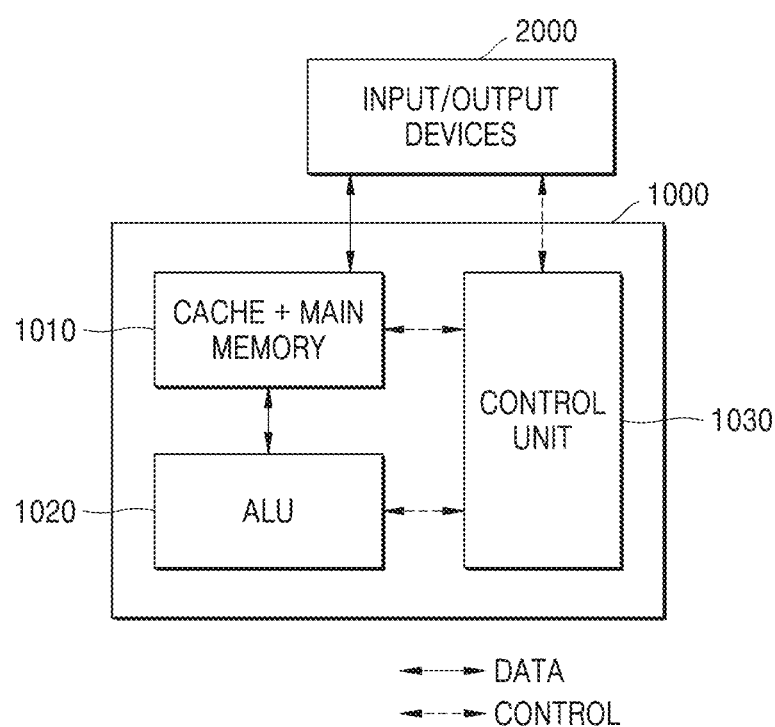
FIGS. 15 and 16 are conceptual diagrams illustrating a device architecture that may be applied to an electronic device according to some example embodiments.
Figure 16:
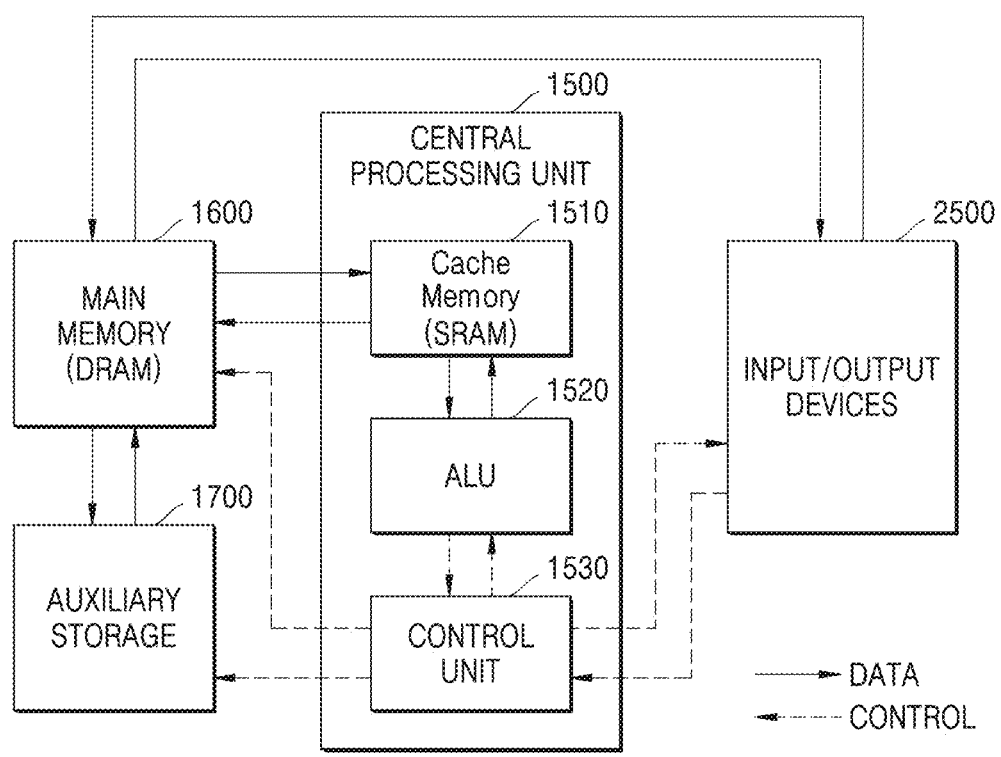

FIGS. 15 and 16 are conceptual diagrams illustrating a device architecture 1000 that may be applied to an electronic device according to some example embodiments.

Referring to FIG. 15, the device architecture 1000 may include a memory unit 1010, an arithmetic logic unit (ALU) 1020, and a control unit 1030. The memory unit 1010, the ALU 1020, and the control unit 1030 may be electrically connected to one another. For example, the device architecture 1000 may be implemented as one chip including the memory unit 1010, the ALU 1020, and the control unit 1030.

The memory unit 1010, the ALU 1020, and the control unit 1030 may be interconnected through a metal line in an on-chip and may communicate, e.g. may directly communicate with one another. The memory unit 1010, the ALU 1020, and the control unit 1030 may be monolithically integrated on one substrate to form one chip. An input/output device 2000 may be connected to the device architecture 1000. Also, the memory unit 1010 may include both a main memory and a cache memory. The device architecture 1000 may be an on-chip memory processing unit. The memory unit 1010, the ALU 1020, or the control unit 1030 may each include the above-described semiconductor device.

Referring to FIG. 16, a cache memory 1510, an ALU 1520, and a control unit 1530 may constitute a central processing unit (CPU) 1500, and the cache memory 1510 may include a static random-access memory (SRAM). Aside from the CPU 1500, a main memory 1600 and an auxiliary storage 1700 may be provided. The main memory 1600 may include a semiconductor device such as DRAM. In some cases, the device architecture may be implemented in a form in which computing unit devices and memory unit devices are adjacent to each other in one chip without any distinction between sub-units.

Figure 17:
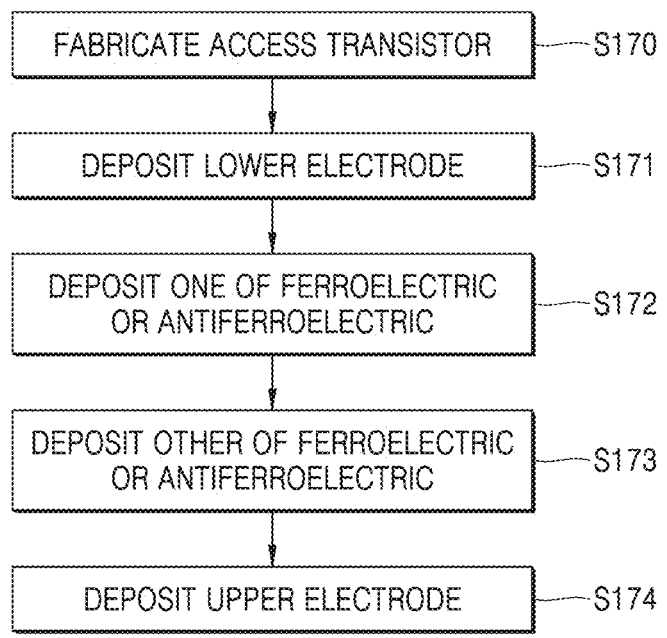
FIG. 17 is a diagram illustrating a method of fabricating a semiconductor device, according to some example embodiments.

FIG. 17 is a flowchart illustrating a method of fabricating a semiconductor device, according to some example embodiments.

Referring to FIG. 17, a method of fabricating a semiconductor device may include fabricating an access transistor (S170). The access transistor may include a source node and a drain node.

The method may further include depositing a lower electrode (S171). The lower electrode may be formed to be connected to/electrically connected to one of the source node and the drain node.

The method may further include depositing a dielectric layer by depositing one of a ferroelectric material and an antiferroelectric material (S172).

The method may further include depositing the other of the ferroelectric material and the antiferroelectric material (S173).

There may or may not be other processes performed such that the antiferroelectric material is dispersed within the ferroelectric material.

The method may further include depositing an upper electrode on the dielectric layer (S174).

According to some example embodiments, by forming a dielectric layer in a structure in which ferroelectrics and antiferroelectrics are mixed with each other, an electric field value for polarization inversion decreases and the dispersion of the electric field value increases. Accordingly, domains causing polarization inversion are present even in a small operating voltage range, resulting in a nonlinear charge Q-voltage V characteristic. Accordingly, as the voltage increases, the slope of a charge Q-voltage V characteristic curve increases, thereby realizing a capacitor device capable of charging and discharging more charges, and of having improved electrical performance.

It should be understood that variously described embodiments described herein should be considered in a descriptive sense only and not for purposes of limitation. Descriptions of features or aspects within each embodiment should typically be considered as available for other similar features or aspects in other embodiments; example embodiments are not necessarily mutually exclusive. While one or more embodiments have been described with reference to the figures, it will be understood by those of ordinary skill in the art that various changes in form and details may be made therein without departing from the spirit and scope as defined by the following claims.

What is claimed is:

1. A capacitor device comprising:
first and second electrodes spaced apart from each other; and a dielectric layer between the first electrode and the second electrode and including a dielectric material, ferroelectrics are dispersed within antiferroelectrics, wherein each of the ferroelectrics and the antiferroelectrics includes hafnium-zirconium oxide, wherein a hafnium element content of the ferroelectrics is greater than a hafnium element content of the antiferroelectrics, wherein the dielectric layer is configured to have an open-hysteresis at an origin of a voltage-polarization graph between a voltage applied to the first and second electrodes and a polarization measured across the dielectric layer, and wherein a charge stored in the capacitor device with respect to a voltage across the dielectric layer increases nonlinearly as the voltage increases from 0.5 volts to 1.0 volts, wherein the ferroelectrics are homogenously dispersed throughout the antiferroelectrics.

2. The capacitor device of claim 1, wherein at least one of the ferroelectrics and the antiferroelectrics further includes a dopant material.

3. The capacitor device of claim 2, wherein the dopant material includes at least one selected from the group including C, Si, Ge, Sn, Pb, Al, Y, La, Gd, Mg, Ca, Sr, Ba, Ti, Zr, and Hf.

4. The capacitor device of claim 1, wherein the ferroelectrics include atoms arranged as an orthorhombic crystal phase, and the antiferroelectrics include atoms arranged as a tetragonal crystal phase.

5. The capacitor device of claim 1, wherein a proportion of the ferroelectrics in the dielectric material is greater than 0% and less than 40%.

6. The capacitor device of claim 1, wherein a transition voltage at a point where a linear slope increases as a voltage increases in a charge (Q)-voltage (V) curve for the dielectric layer is less than a transition voltage at a point where a linear slope increases as a voltage increases in a charge (Q)-voltage (V) curve for the antiferroelectrics.

7. The capacitor device of claim 6, wherein, based on the transition voltage of the charge (Q)-voltage (V) curve for the dielectric layer, the linear slope increases by about 7% or more.

8. The capacitor device of claim 1, wherein one or both of the first electrode and the second electrode includes at least one of a metal, a conductive metal nitride, and a conductive metal oxide.

9. A semiconductor device comprising:
a field effect transistor; and a capacitor device electrically connected to the field effect transistor, wherein the capacitor device includes, first and second electrodes spaced apart from each other, and a dielectric layer between the first electrode and the second electrode and including a dielectric material including ferroelectrics and antiferroelectrics, wherein the ferroelectrics are dispersed within the antiferroelectrics having a second crystal phase, wherein each of the ferroelectrics and the antiferroelectrics includes hafnium-zirconium oxide, wherein a hafnium element content of the ferroelectrics is greater than a hafnium element content of the antiferroelectrics, wherein the dielectric layer is configured to have an open-hysteresis at an origin of a voltage-polarization graph between a voltage applied to the first and second electrodes and a polarization measured across the dielectric layer, and wherein a charge stored in the capacitor device with respect to a voltage across the dielectric increases nonlinearly as the voltage increases from 0.5 volts to 1.0 volts, wherein the ferroelectrics are homogenously dispersed throughout the antiferroelectrics.

10. The semiconductor device of claim 9, wherein at least one of the ferroelectrics and the antiferroelectrics further includes a dopant material.

11. The semiconductor device of claim 10, wherein the dopant material includes at least one selected from the group including C, Si, Ge, Sn, Pb, Al, Y, La, Gd, Mg, Ca, Sr, Ba, Ti, Zr, and Hf.

12. The semiconductor device of claim 9, wherein the ferroelectrics include atoms arranged as an orthorhombic crystal phase, and the antiferroelectrics include atoms arranged as a tetragonal crystal phase.

13. The semiconductor device of claim 9, wherein a proportion of the ferroelectrics in the dielectric material is greater than 0% and less than 40%.

14. The semiconductor device of claim 9, wherein the field effect transistor includes a semiconductor layer including a source and a drain;
a gate insulating layer on the semiconductor layer; and
a gate electrode on the gate insulating layer.

15. An electronic device comprising the semiconductor device according to claim 9.

16. The capacitor device of claim 1, wherein the ferroelectrics are dispersed throughout the antiferroelectrics within a single layer.

17. The semiconductor device of claim 9, wherein the ferroelectrics are dispersed throughout the antiferroelectrics within a single layer.

* * * * *